United States Patent
Noguchi et al.

(10) Patent No.: US 8,344,457 B2
(45) Date of Patent: *Jan. 1, 2013

(54) INSULATED-GATE SEMICONDUCTOR DEVICE WITH PROTECTION DIODE

(75) Inventors: Yasunari Noguchi, Ora-gun (JP); Eio Onodera, Ota (JP); Hiroyasu Ishida, Ora-Gun (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 236 days.

This patent is subject to a terminal disclaimer.

(21) Appl. No.: 12/711,647

(22) Filed: Feb. 24, 2010

(65) Prior Publication Data

US 2010/0148268 A1 Jun. 17, 2010

Related U.S. Application Data

(63) Continuation of application No. 11/860,206, filed on Sep. 24, 2007, now Pat. No. 7,825,474.

(30) Foreign Application Priority Data

Sep. 28, 2006 (JP) ................................ 2006-265387

(51) Int. Cl.
*H01L 23/62* (2006.01)
*H01L 29/66* (2006.01)

(52) U.S. Cl. ........ 257/355; 257/328; 257/367; 257/409; 257/E29.008

(58) Field of Classification Search .................. 257/173, 257/328, 339, 355, 367, 368, 409, E29.008, 257/E29.328, E21.351, E21.361, E29.327

See application file for complete search history.

(56) References Cited

U.S. PATENT DOCUMENTS

| | | | |
|---|---|---|---|
| 3,712,995 | A | 1/1973 | Steudel |
| 5,012,313 | A | 4/1991 | Fujihira |
| 5,079,608 | A | 1/1992 | Wodarczyk et al. |
| 5,726,472 | A | 3/1998 | Higashida |
| 5,973,359 | A | 10/1999 | Kobayashi et al. |
| 6,211,551 | B1 | 4/2001 | Suzumura et al. |
| 6,249,023 | B1 | 6/2001 | Finney |
| 6,548,865 | B2 | 4/2003 | Fujihira et al. |
| 6,563,169 | B1 | 5/2003 | Miyakoshi et al. |
| 6,750,507 | B2 | 6/2004 | Williams et al. |
| 6,965,150 | B2 | 11/2005 | Higashida et al. |
| 7,026,668 | B2 | 4/2006 | Hatakeyama et al. |

(Continued)

FOREIGN PATENT DOCUMENTS

CN 1794451 6/2006

(Continued)

OTHER PUBLICATIONS

Noguchi, Y. et al., U.S. Office Action mailed Mar. 5, 2009, directed to U.S. Appl. No. 11/860,689; 10 pages.

(Continued)

*Primary Examiner* — Teresa M Arroyo

(74) *Attorney, Agent, or Firm* — Morrison & Foerster LLP

(57) ABSTRACT

Channel regions continuous with transistor cells are disposed also below a gate pad electrode. The channel region below the gate pad electrode is fixed to a source potential. Thus, a predetermined reverse breakdown voltage between a drain and a source is secured without forming a p+ type impurity region below the entire lower surface of the gate pad electrode. Furthermore, a protection diode is formed in a conductive layer disposed at the outer periphery of an operation region.

9 Claims, 12 Drawing Sheets

U.S. PATENT DOCUMENTS

| | | |
|---|---|---|
| 7,045,856 B2 | 5/2006 | Hokomoto et al. |
| 7,417,295 B2 | 8/2008 | Kushiyama et al. |
| 7,651,917 B2 | 1/2010 | Kaneko |
| 2001/0009287 A1 | 7/2001 | Fujihira et al. |
| 2002/0050602 A1 | 5/2002 | Narazaki |
| 2002/0088991 A1 | 7/2002 | Hisamoto |
| 2002/0179945 A1 | 12/2002 | Sakamoto et al. |
| 2002/0190285 A1 | 12/2002 | Sakamoto et al. |
| 2003/0006415 A1 | 1/2003 | Yokogawa et al. |
| 2003/0057497 A1 | 3/2003 | Higashida et al. |
| 2004/0206989 A1 | 10/2004 | Aida et al. |
| 2005/0082611 A1 | 4/2005 | Peake et al. |
| 2006/0071257 A1 | 4/2006 | Kang |
| 2006/0131645 A1 | 6/2006 | Kaneko |
| 2006/0255407 A1 | 11/2006 | Ishida |
| 2007/0034943 A1 | 2/2007 | Kushiyama et al. |
| 2007/0262390 A1 | 11/2007 | Ishida et al. |
| 2008/0061326 A1 | 3/2008 | Yoshida et al. |
| 2008/0079078 A1 | 4/2008 | Noguchi et al. |
| 2008/0079079 A1 | 4/2008 | Noguchi et al. |
| 2008/0142799 A1 | 6/2008 | Kaneko |
| 2009/0057757 A1 | 3/2009 | Hokomoto et al. |
| 2009/0078992 A1 | 3/2009 | Kaneko |
| 2009/0261418 A1 | 10/2009 | Yajima |
| 2010/0044749 A1 | 2/2010 | Kitamura et al. |

FOREIGN PATENT DOCUMENTS

| | | |
|---|---|---|
| JP | 1-280359 | 11/1989 |
| JP | 3-71673 | 3/1991 |
| JP | 2002-43574 | 2/2002 |
| JP | 2002-368218 | 12/2002 |

OTHER PUBLICATIONS

Noguchi, Y. et al., U.S. Office Action mailed Sep. 15, 2009, directed to U.S. Appl. No. 11/860,689; 12 pages.

Noguchi, Y. et al., U.S. Office Action mailed Mar. 6, 2009, directed to U.S. Appl. No. 11/860,206; 12 pages.

Noguchi, Y. et al., U.S. Office Action mailed Sep. 10, 2009, directed to U.S. Appl. No. 11/860,206; 17 pages.

Noguchi et al., U.S. Office Action mailed Mar. 19, 2010, directed to U.S. Appl. No. 11/860,206; 15 pages.

Yajima, U.S. Office Action mailed Mar. 24, 2011, directed to related U.S. Appl. No. 12/425,893; 9 pages.

Prior Art

Prior Art

INSULATED-GATE SEMICONDUCTOR DEVICE WITH PROTECTION DIODE

CROSS-REFERENCE OF THE INVENTION

This application is a continuation of Ser. No. 11/860,206 filed Sep. 24, 2007, which claims priority from Japanese Patent Application No. 2006-265387 filed Sep. 28, 2006, the contents of which are incorporated herein by reference in their entireties.

BACKGROUND OF THE INVENTION

1. Field of the Invention

The present invention relates to an insulated-gate semiconductor device, and particularly to an insulated-gate semiconductor device in which an operation region is sufficiently secured, and in which a high reverse breakdown voltage is maintained.

2. Description of the Related Art

In a conventional insulated-gate semiconductor device, a transistor cell is not disposed below a gate pad electrode. This technology is described, for instance, in Japanese Patent Application Publication No. 2002-368218 (FIG. 6 to FIG. 8).

Meanwhile, a protection diode is disposed below the gate pad electrode in some cases, and a number of pn junctions are connected to each other in series in the protection diode, for example. Moreover, a diffusion region of high-concentration impurities is sometimes formed in a substrate below the gate pad electrode in order to secure a reverse breakdown voltage between a drain and a source.

FIGS. 11A and 11B show one example of an n channel MOSFET as the conventional insulated-gate semiconductor device, in which a p+ type impurity region is formed below the gate pad electrode.

FIG. 11A is a plan view of the MOSFET. Note that, interlayer insulating films on the surface of the substrate are omitted in FIG. 11A. Metal electrode layers (a source electrode 47, a gate pad electrode 48, and a gate wiring 48a) are indicated by the dashed lines.

Gate electrodes 43 are formed into a stripe shape on the surface of a semiconductor substrate 31 with gate oxide films 41 interposed therebetween. The gate electrodes 43 are formed by patterning polysilicon which has been deposited and then doped with impurities to reduce the resistance. Source regions 45 are formed in the surface of the substrate 31 along the gate electrodes 43. The source regions 45 are formed along the gate electrodes 43, and have a stripe shape.

The source electrode 47 is formed on an operation region 51 where transistor cells are disposed. The gate pad electrode 48 is disposed on one edge of a chip. The gate wiring 48a, which is connected to the gate pad electrode 48, is formed around the chip.

FIG. 11B is a cross-sectional view taken along the line f-f in FIG. 11A.

The semiconductor substrate 31 provided with a drain region by stacking an n+ type silicon semiconductor substrate 31a with an n− type epitaxial layer 31b or the like. Multiple p type channel regions 34 are formed into a stripe shape in the surface of the semiconductor substrate 31. The multiple gate electrodes 43 are disposed into the stripe shape on the surface of the semiconductor substrate 31 on sides of the channel regions 34 while the gate insulating films 41 are interposed between the gate electrodes 43 and the semiconductor substrate 31. The n+ type source regions 45 are formed in the surface of the channel region 34 which is adjacent to the gate electrodes 43. The top of the gate electrode 43 is covered with the interlayer insulating film 46, and the source electrode 47 is formed thereon. The source electrode 47 is in contact with the source regions 45. The region surrounded by the gate electrodes 43 serves as the single transistor cell. A large number of these cells are disposed to form the operation region 51.

The gate pad electrode 48 is formed above the n− type semiconductor layer 31b outside the operation region 51. The gate pad electrode 48 is connected to the gate electrodes 43 in the operation region 51. Moreover, a protection diode 43d formed by doping impurities in polysilicon is disposed below the gate pad electrode 48. The p+ type impurity region 49 is formed in the same pattern as that of the protection diode 43d.

When the reverse voltage is applied between the source and the drain, depletion layers are spread from pn junctions between the channel regions 34 and the n− type semiconductor layers 31b over the operation region 51, thereby securing the reverse breakdown voltage between the source and the drain. Meanwhile, the protection diode 43d is formed on the one edge of the chip, the transistor cells (channel regions 34) are not disposed in the substrate surface below the protection diode 43d. For this reason, the p+ type impurity region 49 is formed in the substrate surface below the protection diode 43d. For example, if the pn junction is ended at the end portion of the operation region 51, the curvature of the depletion layer spreading at this region is increased, resulting in a problem that the reverse breakdown voltage between the source and the drain is deteriorated due to the electric field concentration. However, by forming the p+ type impurity region 49, the spreading of the depletion layer at the end portion of the operation region 51 can be moderately extended to the one edge of the chip. In other words, the curvature at the end of the operation region 51 is decreased, allowing the electric field concentration to be mitigated. Thus, it is possible to secure a predetermined reverse breakdown voltage between the source and the drain.

The protection diode 43d is made into a rectangular shape by patterning the polysilicon as shown in FIGS. 11A and B, for example. In the protection diode 43d, a number of pn junctions are formed in concentric circles as shown by the chain lines. Specifically, in the conventional art, the protection diode 43d having a large area is patterned below the entire lower surface of the gate pad electrode 48 so as to overlap the gate pad electrode 48. Accordingly, the p+ type impurity region 49 having the large area needs to be disposed from the outside of the operation region 51 where the transistor cells are not disposed to the one edge of the chip.

FIG. 12A and FIG. 12B are diagrams for describing the p+ type impurity region 49. FIG. 12A shows a perspective view of the p+ type impurity region 49 at the circle portion in FIG. 11A as viewed from the operation region 51 where the transistor cells (MOSFET) are disposed. FIG. 12B shows a plan view of another pattern of the p+ type impurity region 49, while omitting the interlayer insulating films on the surface, and indicating the metal electrode layers are indicated by the dashed lines.

The p+ type impurity region 49 is a diffusion region, and has the curvature of a spherical shape (FIG. 12A) at the end portion (the junction surface with the n− type epitaxial layer 31b) indicated by the circle in FIG. 11A. Here, suppose a case where a higher (for example, several hundreds V) reverse breakdown voltage is needed between the drain and the source in the pattern shown in FIG. 11. In this case, even if the p+ type impurity region 49 is disposed, high electric field is concentrated at the end portion (indicated by the arrows in FIG. 12A) having the curvature of the spherical shape.

Accordingly, it is impossible to obtain a desired reverse breakdown voltage between the drain and the source.

Moreover, in order to reduce the on-resistance of the device, the specific resistance in the n− type epitaxial layer 31b needs to be reduced, for example. In such a case, the pattern of the p+ type impurity region 49 shown in FIG. 11 leads to decrease in the reverse breakdown voltage between the source and the drain.

In other words, when the property required for the operation region 51 is changed, the pattern of the p+ type impurity region 49 needs to be modified, besides the operation region 51, in order to obtain a predetermined reverse breakdown voltage between the source and the drain.

Specifically, by decreasing the curvature of the spherical shape, it is possible to secure a sufficient reverse breakdown voltage between the drain and the source. More specifically, as shown in FIG. 12B, by decreasing the curvature at corners of the p+ type impurity region 49 in the plane pattern, it is possible to decrease the curvature of the spherical shape shown in FIG. 12A, and accordingly to secure a predetermined reverse breakdown voltage.

Nevertheless, when the protection diode 43d is patterned below the gate pad electrode 48 so as to be substantially overlapped with the gate pad electrode 48, the p+ type impurity region 49 needs to be formed so as to cover the substrate surface below the protection diode 43d. In other words, since the p+ type impurity region 49 is formed in the same pattern as that of the protection diode 43d, the curvature at the corners thereof is caused to be small. Accordingly, in the pattern shown in FIG. 12, the transistor cells are hindered from being disposed adjacent to the gate pad electrode 48. It is inevitable not only to regulate or modify the design of the p+ type impurity region 49, but also to reduce the operation region (area for disposing the transistor cells).

SUMMARY OF THE INVENTION

The invention provides an insulated-gate semiconductor device that includes a plurality of gate electrodes elongated in a first direction, a conductive layer surrounding the gate electrodes, and a plurality of pn junction diodes formed in the conductive layer.

The invention also provides an insulated-gate semiconductor device that includes a semiconductor substrate of a first general conductivity type, a plurality of gate electrodes formed on or in a surface portion of the semiconductor substrate in a form of stripes running in a first direction, a plurality of channel regions of a second general conductivity type formed in the surface portion in a form of stripes running in the first direction, a first insulating film formed between each of the gate electrodes and a corresponding channel region, a plurality of source regions of the first general conductivity type formed in the channel regions in a form of stripes running in the first direction, a gate pad electrode formed on the surface portion so that portions of the channel regions are disposed under the gate pad electrode, a plurality of pn junction diodes formed on the surface portion outside an lateral area of the gate pad electrode so as to extend in the first direction, and a second insulating film formed on each of the gate electrodes, on the pn junction diodes and on the portions of the channel regions.

DETAILED DESCRIPTION OF THE PREFERRED EMBODIMENTS

Description will be given specifically of embodiments according to the present invention by exemplifying an n channel MOSFET as an insulated-gate semiconductor device with reference to FIG. 1 to FIG. 10.

FIG. 1 to FIG. 7 show a first embodiment of the present invention.

Figure 1A:
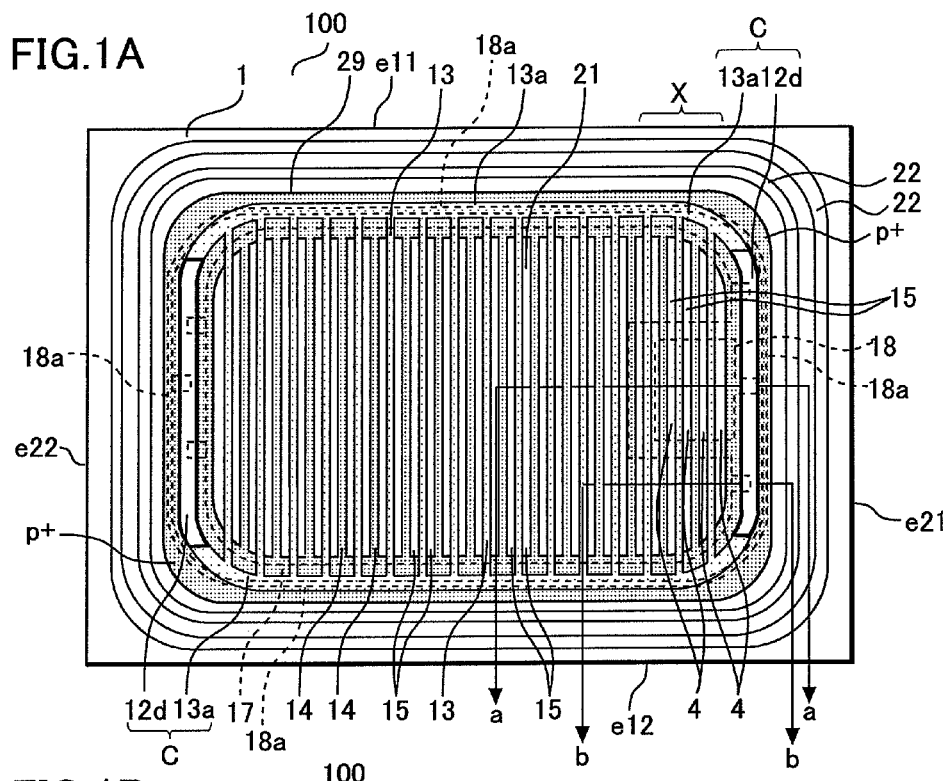
FIG. 1A and FIG. 1B are plan views of a semiconductor device according to a first embodiment of the present invention.
Figure 1B:
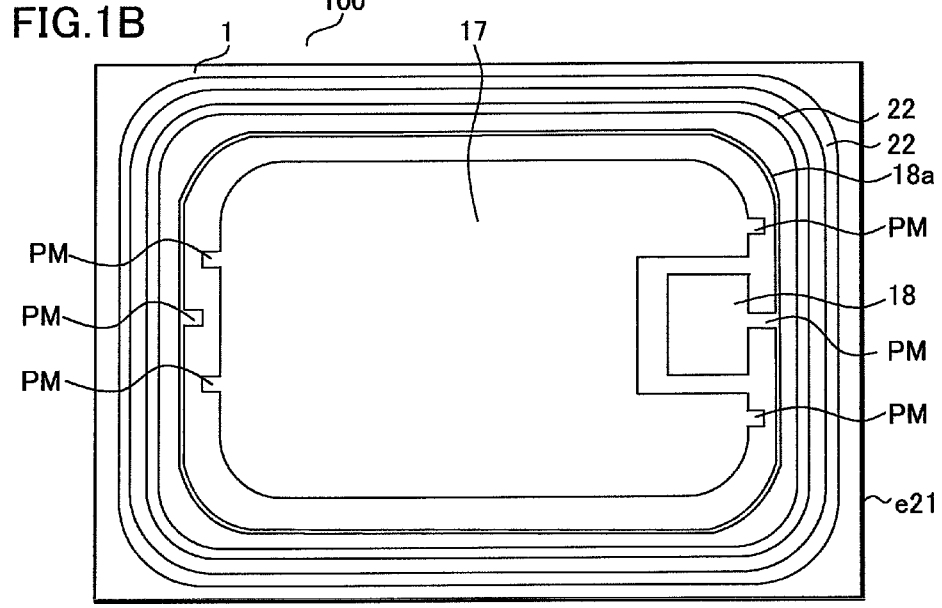

FIG. 1A and FIG. 1B are plan views showing a chip on the MOSFET according to the first embodiment of the present invention. FIG. 1A is the plan view showing metal electrode layers (a source electrode, a gate pad electrode, and a gate wiring) by the dashed lines, omitting interlayer insulating films. FIG. 1B is the plan view showing a pattern of the source electrode, the gate pad electrode and the gate wiring.

A MOSFET 100 according to the first embodiment mainly includes: an n type semiconductor substrate 1, channel regions 4, first insulating films 11, gate electrodes 13, source regions 15, body regions 14, second insulating films 16, a gate pad electrode 18, a source electrode 17, and protection diodes 12d.

As shown in FIG. 1A, the gate electrodes 13 are formed into a stripe shape on the surface of the n type semiconductor substrate 1 with gate oxide films which is the first insulating films (unillustrated here) interposed therebetween. The gate electrodes 13 are formed by patterning polysilicon which has been deposited and then doped with impurities to reduce the resistance.

The channel regions 4 are p type impurity regions formed in the surface of the n type semiconductor substrate 1 into a stripe shape along the gate electrodes 13.

The source regions 15 are n+ impurity regions formed in the surface of the channel regions 4 along the gate electrodes 13. Each of the body regions 14 is a p+ type impurity region formed along the gate electrodes 13, and between the adjacent source regions 15 in the surface of the channel region 4, so as to stabilize the electric potential of the substrate.

It is noted that conductivity types such as p+, p and p− belong in one general conductivity type and conductivity types such as n+, n and n− belong in another general conductivity type.

The source regions 15 and the channel region 4 (body region 14), which are surrounded by the gate electrodes 13, form a transistor cell of the MOSFET with a stripe shape. A large number of the transistor cells are disposed to form an operation region 21 of the MOSFET 100. The transistor cells are disposed up to one edge of the chip. All the gate electrodes 13 are connected to a conductive layer C at the periphery of the n type semiconductor substrate (semiconductor chip) 1. The conductive layer C surrounds the outer periphery of the operation region 21 where the gate electrodes 13 are disposed, and extends along each side of the substrate 1. The conductive layer C is polysilicon disposed on the substrate 1 with the gate oxide film interposed therebetween, and continuously formed into a ring shape. Gate leading electrodes 13a are &lulled in parts of the conductive layer C, and the protection diode 12d is formed in the other parts of the conductive layer C, by doping with desired impurities. Incidentally, the formation region of the protection diode 12d is indicated by the bold lines for the convenience of the description in FIG. 1A.

The gate electrodes 13 extend in a first direction of the semiconductor substrate (semiconductor chip) 1, while the gate electrodes 13a extend along the sides of the chip, that is, in a second direction. In other words, the gate leading electrode 13a extends along chip sides e11 and e12, that is, in the direction perpendicular to the gate electrodes 13, and are doped with impurities to reduce the resistance as similar to the gate electrodes 13. The gate electrodes 13 are connected to the gate pad electrode 18 via the gate leading electrode 13a.

Meanwhile, the protection diode 12d extends in the same direction as the gate electrodes 13 which extend in the first direction. In other words, the protection diode 12d is disposed along chip sides e21 and e22 which are parallel to the gate electrodes 13. The protection diode 12d is connected to the gate pad electrode 18 and the source electrode 17. Description of the protection diode 12d will be given later.

The gate pad electrode 18 is disposed along one side (for example, the chip side e21) of the semiconductor chip 1. Note that, although FIG. 1 shows an example of the gate pad electrode 18 disposed near the center of the chip side e21, the gate pad electrode 18 may be disposed at a corner of the semiconductor chip 1. The gate pad electrode 18 is a metal electrode layer formed above the n+ type semiconductor substrate 1 with the interlayer insulating films which is the second insulating films (unillustrated here) interposed therebetween. Moreover, a gate wiring 18a is formed on the semiconductor substrate 1 at the outer periphery of the operation region 21 via the interlayer insulating films, and connected to the gate pad electrode 18. The gate wiring 18a and the gate pad electrode 18 are made of the same metal electrode layer. The gate wiring 18a is disposed outside the conductive layer C (protection diode 12d) on the chip sides e21 and e22, and is disposed as being superposed on the conductive layer C (gate leading electrode 13a) on the chip sides e11 and e12. Specifically, the gate leading electrode 13a is in contact with the gate wiring 18a on the chip sides e11 and e12, and thereby the gate voltage is applied to the gate electrode 13 of each transistor cell.

A p+ type impurity region 29 is formed in the surface of the n type semiconductor substrate 1 below the conductive layer C in a ring shaped pattern as being substantially superposed with the conductive layer C. The p+ type impurity region 29 is disposed below the protection diode 12d also. The p+ type impurity region 29 surrounding the outer periphery of the chip is connected to the channel regions 4 with the stripe shape, and thereby applied with the same source potential as the channel regions 4 are. As a result, the curvature of a depletion layer at the outer periphery of the chip is mitigated.

Although the channel regions 4 and the body regions 14 are disposed below the gate pad electrode 18, the gate pad electrode 18 is not in contact therewith. Additionally, no source region 15 is disposed in the channel regions 4 below the gate pad electrode 18.

Guard rings 22 which are diffusion region are disposed in the surface of the n type semiconductor substrate 1 around the gate leading electrodes 13a as necessary. The guard rings 22 are, for example, p type impurity regions to which any electric potential is applied.

The source electrode 17 is formed adjacent to and surrounds the gate pad electrode 18 as shown in FIG. 1B. The source electrode 17 is made of the same metal electrode layer as that of the gate pad electrode 18, covers a large area of the operation region 21, and thereby electrically connects to each transistor cell.

The transistor cells according to this embodiment are stripe-shaped. Accordingly, the transistor cells in an X area shown in FIG. 1A are also applied with a predetermined electric potential by the source electrode 17 (see FIG. 1B), and performs the transistor operation while the potential is fixed.

It should be noted, however, that the source regions 15 in the transistor cells in the X region are divided on both side of the gate pad electrode 18. Specifically, the body regions 14 and the source regions 15 are disposed in the surfaces of the channel regions 4 at the operation region 21 below the source electrode 17, and thus the channel regions 4 are not exposed in the plan view of FIG. 1A. On the other hand, below the gate pad electrode 18, the channels 4 (and the body regions 14) are exposed.

Accordingly, when predetermined electric potentials (a gate potential and a source potential) are applied to the gate electrodes 13 and the channel regions 4 with the stripe shapes, only the transistor cells below the source electrode 17 perform the transistor operation. Meanwhile, since some of the channel regions 4 are extended below the gate pad electrode 18 also, the source potential is applied thereto.

Additionally, as shown in FIG. 1B, protruding parts PM are formed on both the gate wiring 18a and the source electrode 17 for connecting to the protection diode 12d which is the part of the conductive layer C.

Figure 2:
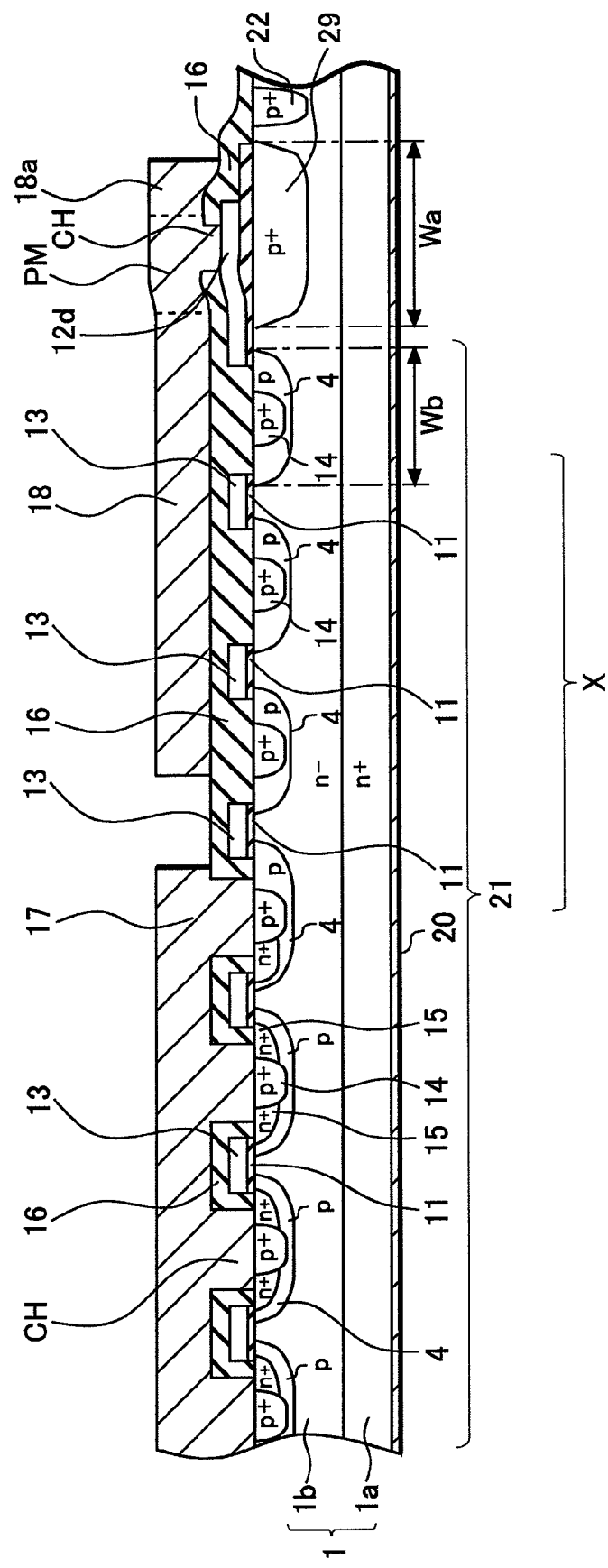
FIG. 2 is a cross-sectional view of the semiconductor device according to the first embodiment of the present invention.
Figure 3:
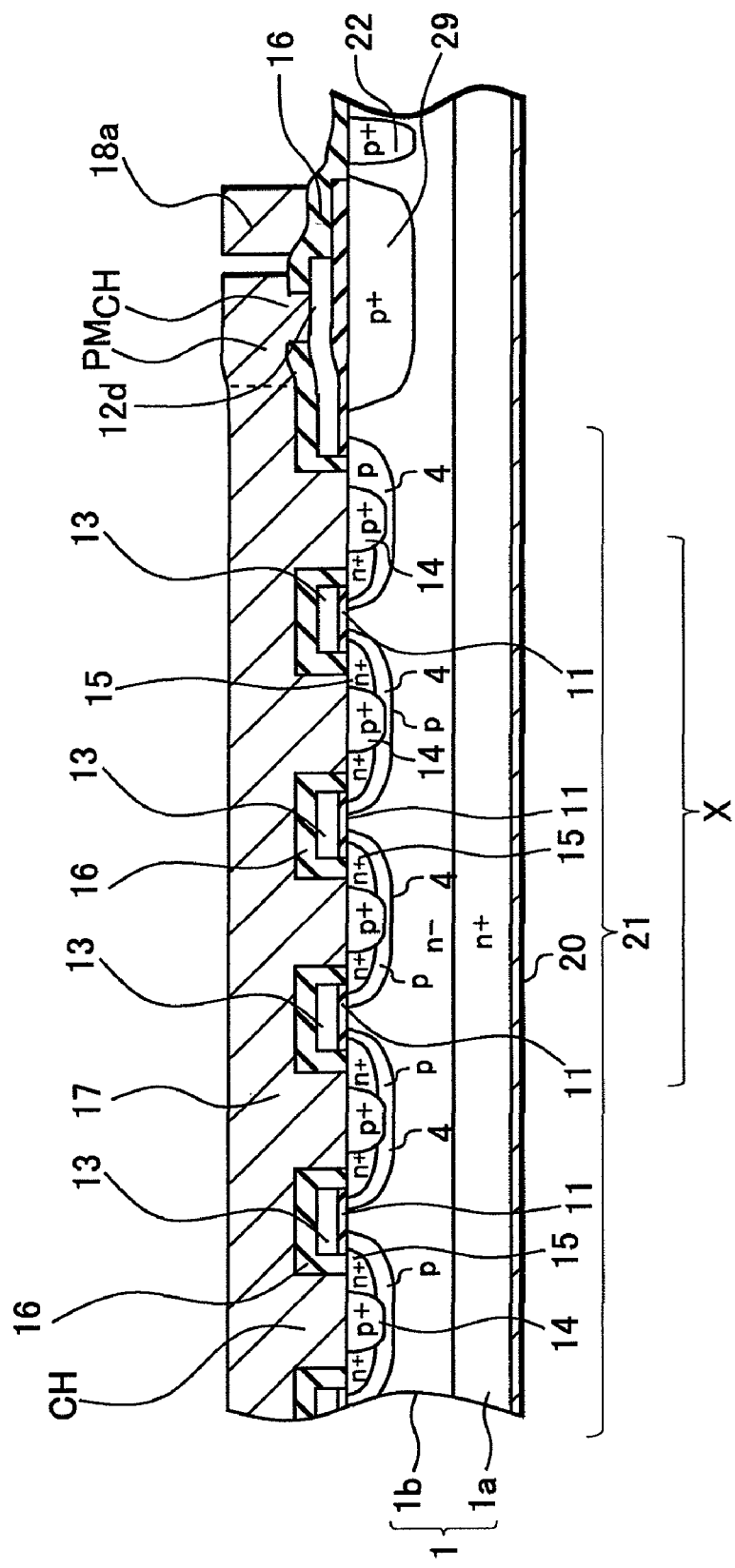
FIG. 3 is a cross-sectional view of the semiconductor device according to the first embodiment of the present invention.

FIG. 2 and FIG. 3 show cross-sectional views of the MOSFET according to this embodiment. FIG. 2 is the cross-sectional view taken along the line a-a in FIG. 1A. FIG. 3 is the cross-sectional view taken along the line b-b in FIG. 1A.

In the n type semiconductor substrate 1, a drain region is formed by stacking an n+ type silicon semiconductor substrate 1a with n− type semiconductor layer 1b, for example. The n− type semiconductor layer 1b is, for example, an epitaxial layer. The multiple channel regions 4 are formed in the surface of the n− type semiconductor layer 1b into the stripe shape.

The source regions 15, which are n+ type impurity regions, as well as the body region 14, which is a p+ type impurity region, are formed in the surface of the channel region 4 below the source electrode 17. The gate electrode 13 made of the polysilicon is disposed into the stripe shape on the substrate surface between the adjacent channel regions 4 with the gate oxide films between the substrate and the gate electrode 13. The source regions 15 are formed on both sides of the gate electrodes 13 so as to be partially superposed with the corresponding gate electrodes 13. The body region 14 is disposed in the surface of the channel region 4 between the adjacent source regions 15.

Specifically, the channel region 4, the source regions 15 and the body region 14 are disposed into the stripe shapes on both sides of and along the gate electrodes 13 with the stripe shape.

The interlayer insulating film 16 made of a BPSG (Boron Phosphorus Silicate Glass) film or the like is formed on the top surface and side surfaces of the gate electrode 13. Thus, the periphery of the gate electrode 13 is covered with the gate insulating film 11 and the interlayer insulating film 16.

The source electrode 17 is formed by patterning the metal electrode layer into a predetermined shape on the interlayer insulating films 16 (see FIG. 1B).

As shown in FIG. 2, contact holes CH are formed in the interlayer insulating films 16 below the source electrode 17. The source electrode 17 is in contact with the source regions 15 and the body regions 14 (channel regions 4) via the contact holes CH.

The gate electrodes 13, the body regions 14, the channel regions 4, the gate oxide films 11 and the interlayer insulating films 16, which are continuous with the transistor cells are disposed below the gate pad electrode 18. The gate pad electrode 18 applies the gate potential to one end of the protection diode 12d via the contact hole CH formed in the interlayer insulating film 16 and the protruding part PM.

Moreover, the gate pad electrode 18 is connected, via the protruding part PM, to the gate wiring 18a extending along the chip side e21 of the semiconductor chip 1. The gate wiring 18a is in contact with the gate leading electrode 13a via the contact holes CH formed in the interlayer insulating films 16 on the chip sides e11 and e12 (unillustrated here), and thus applies the gate potential to the gate electrodes 13 (see FIG. 1).

As described above, no source region 15 is disposed in the channel regions 4 below the gate pad electrode 18, and then no transistor cell is formed below the gate pad electrode 18. Meanwhile, the body regions 14 and the channel regions 4 below the gate pad electrode 18 are connected to the source electrode 17 (FIG. 1A), and then the source potential is applied thereto.

As shown in FIG. 3, the gate electrodes 13, the channel regions 4, the body regions 14 and the source regions 15 with the stripe shapes are formed below the source electrode 17 surrounding the gate pad electrode 18 in the X region, and thus the transistor cell is formed.

The channel regions 4 and the body regions 14 in the X region are up to below the gate pad electrode 18. In this embodiment, the region where the channel regions 4 are disposed in FIG. 2 and FIG. 3 is the operation region 21.

Moreover, the source electrode 17 applies the source potential to the other end of the protection diode 12d via the contact hole CH formed in the interlayer insulating films 16 and the protruding parts PM.

As shown in FIG. 2 and FIG. 3, the source potential is applied to the channel regions 4 below the gate pad electrode 18 as in the case of the channel regions 4 of the transistor cell. Moreover, the channel regions 4 (and also the body regions 14) below the gate pad electrode 18 are formed in the same pattern as that of the operation region 21. The channel regions 4 (and also the body regions 14) in the operation region 21 are formed in a condition where the breakdown voltage required for the MOSFET is secured. Thus, the reverse breakdown voltage between the drain and the source equal to that of the operation region 21 is secured even in the channel regions 4 below the gate pad electrode 18.

For this reason, the channel region 4 with the stripe shape makes it possible to secure the reverse breakdown voltage between the drain and the source below the gate pad electrode 18. Thus, the conventional p+ type impurity region with a large area is no longer necessary.

In other words, it suffices to form the p+ type impurity region 29 according to this embodiment only at the outer periphery of the chip where no channel region 4 is disposed. It is only necessary that the p+ type impurity region 29 be formed in the pattern of being substantially superposed with the conductive layer C with the ring shape, and thereby a width Wa of the p+ type impurity region 29 is greatly reduced as compared to that of the conventional impurity region.

Specifically, the width Wa of the p+ type impurity region 29 is larger than a width Wb of the channel region 4, and for example 50 μm in a case where the breakdown voltage is approximately 600V. In the conventional art (FIG. 11) where the impurity region is formed in the entire surface below the protection diode 43d, a width Wc of the p+ type impurity region 49 is, for example, 400 μm. Thus, the width Wa is reduced to approximately ⅛ of that of the conventional impurity region.

Conventionally, the protection diode 43d with the concentric-circular shape and the p+ type impurity region 49 having a large area superposed therewith are disposed below the gate pad electrode 48. When the breakdown voltage required for the operation region 51 is changed, the pattern of the p+ type impurity region 49 (curvature at the corners) also needed to be modified appropriately.

In the meanwhile, according to this embodiment, by forming the channel regions 4 (body regions 14) with the same design rule (size and impurity concentration) as that of the operation region 21 below the gate pad electrode 18, the reverse breakdown voltage between the drain and the source equal to the breakdown voltage required for the operation region 21 is secured below the gate pad electrode 18.

Moreover, when the breakdown voltage in the operation region 21 is modified, a predetermined breakdown voltage is secured below the gate pad electrode 18 also by modifying the setting value of the channel regions 4 in the operation region 21. In other words, as the setting value in the operation region 21 is modified, a predetermined reverse breakdown voltage between the drain and the source is secured below the gate pad electrode 18.

The p+ type impurity region 29 surrounds the outer periphery of the chip where no channel region 4 is disposed, and connected to the channel regions 4 with the stripe shape (FIG. 1A). Accordingly, the p+ type impurity region 29 and the channel regions 4 have the same electric potential (the source potential). Thus, when the reverse voltage is applied between the source and the drain, the curvature of the depletion layer is decreased at the outer periphery of the chip where no channel region 4 is disposed, and thereby the electric field concentration is suppressed.

The guard rings 22, which are the diffusion regions of the p+ type impurities, are formed at the outer periphery of the p+ type impurity region 29 as necessary. No electric potential is applied to the guard rings 22, and thereby the electric field concentration which occurs between the source and the drain around the p+ type impurity region 29 is mitigated.

Furthermore, a drain electrode 20 is formed on the back surface of the n type semiconductor layer 1 where the drain electrode 20 comes into contact with the n+ type semiconductor substrate 1a.

Next, description will be given of the protection diode 12d. The channel regions 4 according to this embodiment are formed by self-alignment using the polysilicon (gate electrodes 13) with the stripe shape as a mask.

In this respect, a method to form pn junction diodes into the polysilicon left below the gate pad electrode 18 is conceivable to use. Nevertheless, in order to form the protection diodes, it is necessary to bring the diodes into contact with the gate pad electrode 18 and the source electrode 17. As the gate electrodes 13 (the polysilicon to serve as the mask for forming the channel regions 4) are downsized accompanying with the downsized transistor cells, it is made difficult to form the contact holes in the insulating film disposed between the diodes and the electrodes 17 and 18.

For this reason, p type and n type semiconductor regions are formed in the parts of the conductive layer C which surrounds all the gate electrodes 13, and which is disposed at the periphery of the semiconductor chip 1. Then, one end of the semiconductor regions is connected to the gate pad electrode 18, and the other end is connected to the source electrode 17, and thereby the protection diode 12d is formed.

Hereinafter, description will be given of the protection diode 12d with reference to FIG. 4 to FIG. 7.

Figure 4:
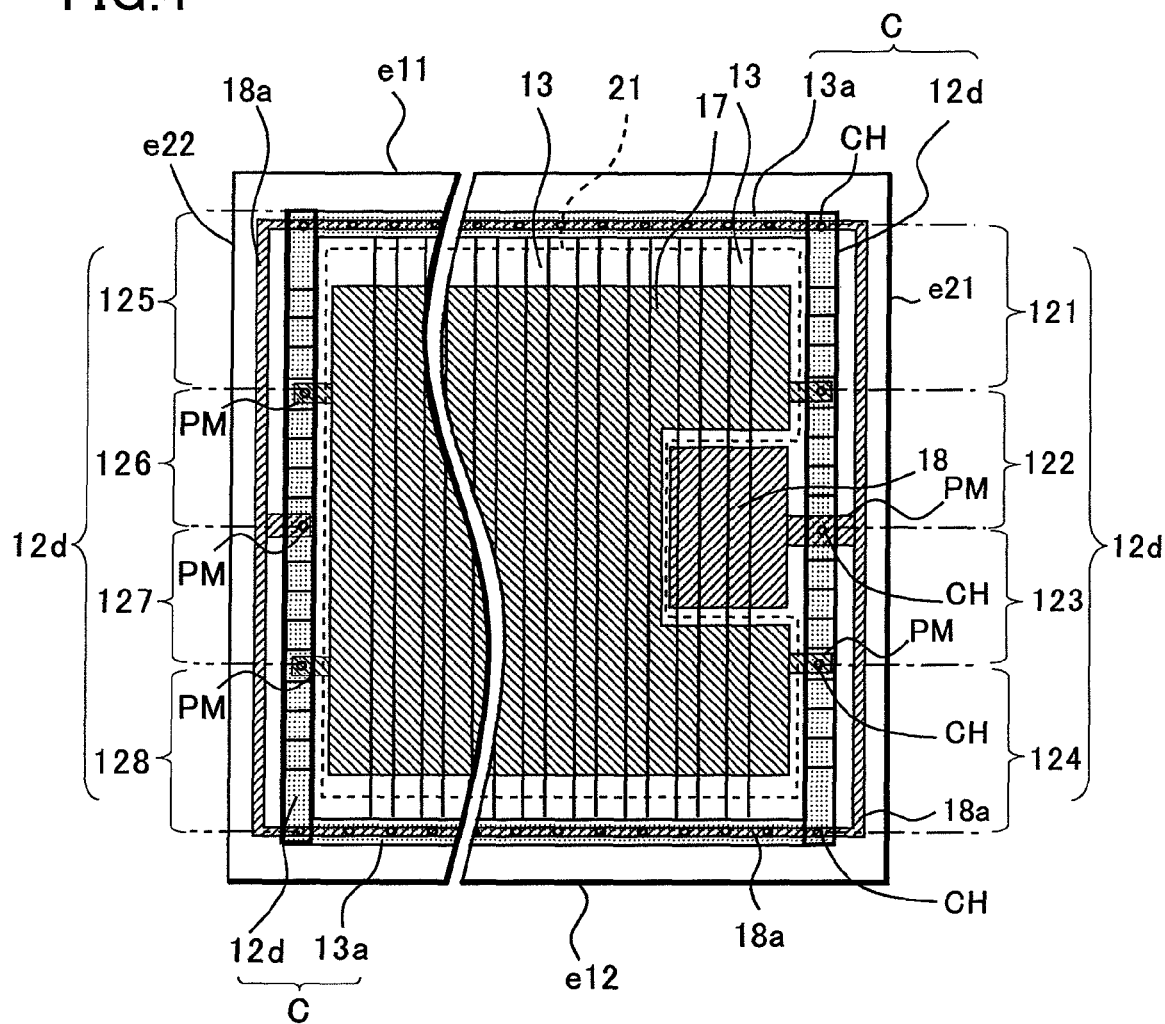
FIG. 4 is a schematic plan view of the semiconductor device according to the first embodiment of the present invention.
Figure 5:
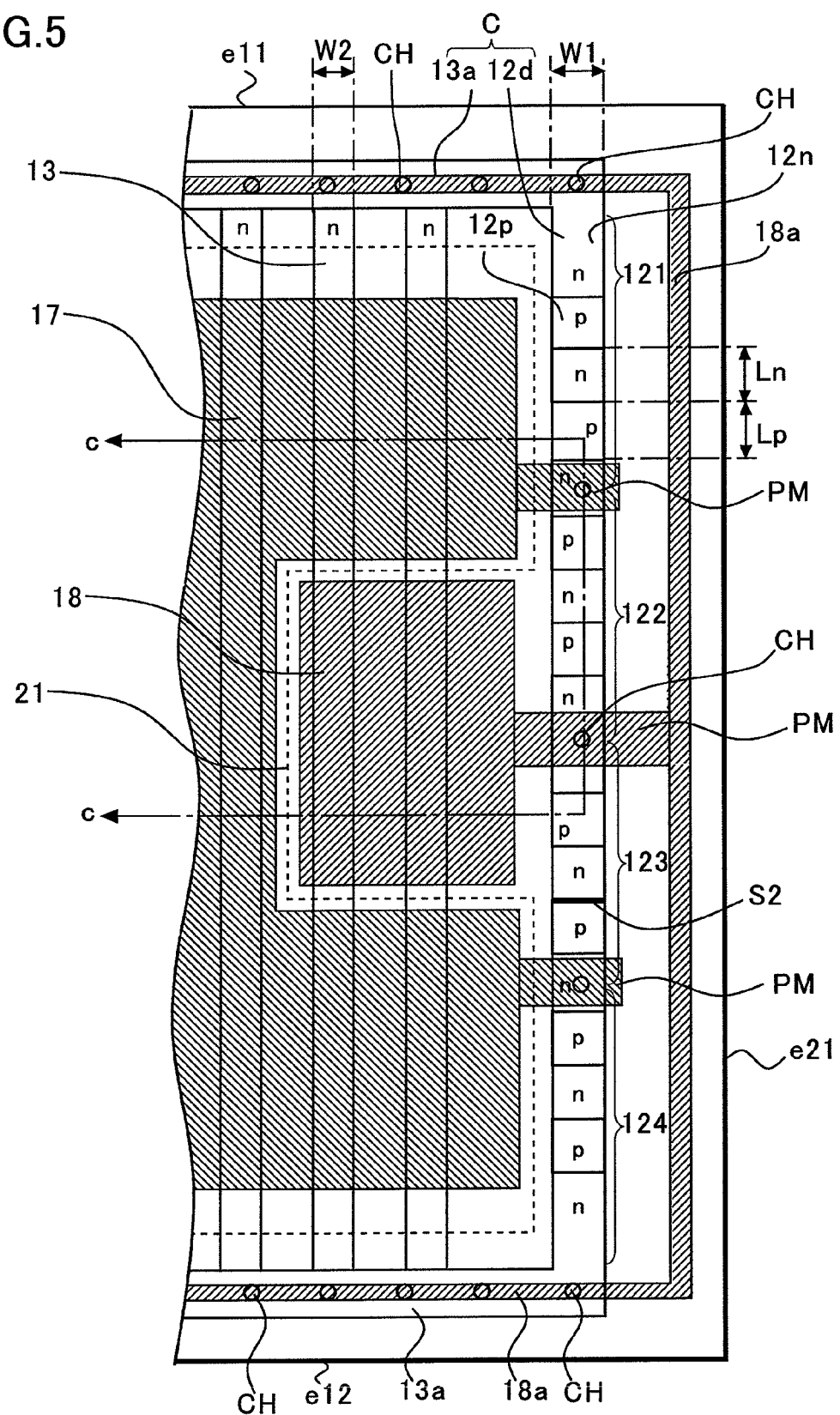
FIG. 5 is an enlarged plan view of the semiconductor device according to the first embodiment of the present invention.
Figure 6A:
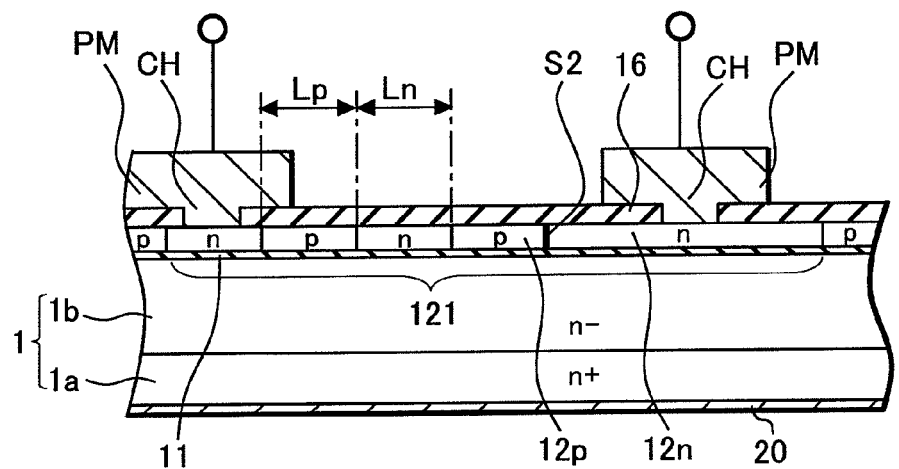
FIG. 6A is a cross-sectional view.
Figure 6B:
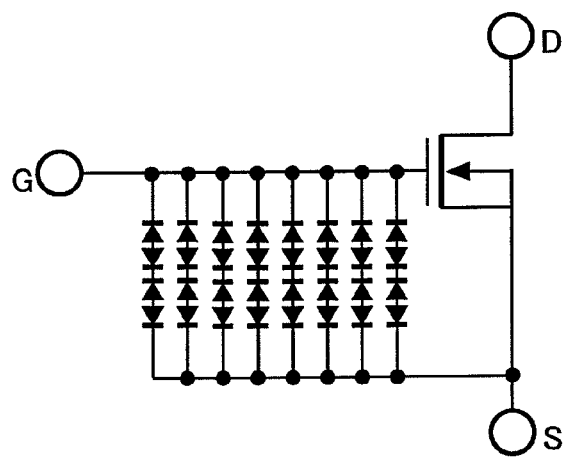
FIG. 6B is a circuit diagram, of the semiconductor device according to the first embodiment of the present invention.

FIG. 4 to FIG. 6 are diagrams for describing the protection diode 12d according to this embodiment. FIG. 4 is the schematic plan view for describing the protection diode 12d. FIG. 5 is the enlarged plan view of FIG. 4. FIG. 6A is the cross-sectional view taken along the line c-c in FIG. 5. FIG. 6B is the equivalent circuit diagram of the protection diode 12d.

Note that, FIG. 4 and FIG. 5 schematically shows a configuration of the operation region 21, which is indicated by the dashed line, other than that of the protection diode 12d.

As shown in FIG. 4 and FIG. 5, the conductive layer C which surrounds all the gate electrodes 13 is formed at the periphery of the semiconductor chip 1. The conductive layer C is formed in the ring shape as each side thereof is along the chip sides e11, e12, e21 and e22. The chip sides e11 and e12 are in a direction perpendicular to the gate electrode 13, and, the chip sides e21 and e22 are in a direction parallel to the gate electrode 13.

The conductive layer C has a shape of the continuous ring. The parts of the conductive layer C are used to form the gate leading electrodes 13a, and the other parts are used to form the protection diode 12d. For the convenience of the description in FIG. 4, the conductive layer C is indicated by the hatching with dots, and the formation region of the protection diode 12d is indicated by the bold line.

According to this embodiment, the gate electrodes 13 and the gate leading electrodes 13a are doped with n type impurities, and connected to the n type semiconductor region 12n at the one end of the protection diode 12d (FIG. 5).

The protection diode 12d is formed in the conductive layer C extending on the chip sides e21 and e22 which are parallel to the gate electrodes 13.

Here, the protection diode 12d as a whole is formed of eight pn junction diodes as an example. Specifically, the four pn junction diodes 121 to 124 are disposed on the chip side e21, and the four pn junction diodes 125 to 128 are disposed on the chip side e22.

Hereinafter, description will be given of the pn junction diode 121. The configurations of the other pn junction diodes 122 to 128 are the same as that of the pn junction diode 121.

The pn junction diode 121 is formed as follows. Firstly, the p type semiconductor regions 12p and the n type semiconductor regions 12n are alternately disposed adjacent to one another by implanting ions of p type and n type impurities, or by the deposition (PBF (Poly Boron Film) and $POCl_3$), into the conductive layer (polysilicon) C extending along the chip side e21 (e22). Accordingly, pn junctions are formed. Then, on one end (for example, the n type impurity region 12n) is connected to the gate pad electrode 18, and the other end (for example, another n type impurity region 12n) is connected to the source electrode 17.

The gate wiring 18a connected to the gate pad electrode 18 is formed as surrounding the outer periphery of the operation region 21 indicated by the dashed line. The gate wiring 18a is superposed above the conductive layer C on the chip sides e11 and e12, and disposed outside the conductive layer C on the chip sides e21 and e22.

Moreover, the gate pad electrode 18 is connected, via the protruding part PM, to the gate wiring 18a extending along the chip side e21. The gate wiring 18a is in contact with the gate leading electrode 13a via the contact holes CH formed in the interlayer insulating films 16 on the chip sides e11 and e12, and thus applies the gate potential to the gate electrodes 13.

One end of the pn junction diode 121, which is continuous with the gate leading electrode 13a, is connected to the gate pad electrode 18 via the gate wiring 18a which is formed on and in contact with, the gate leading electrode 13a. Meanwhile, the other end of the pn junction diode 121 is not disposed by the gate wiring 18a thereon, but is connected to the source electrode 17 via the protruding part PM.

Furthermore, one end of the pn junction diode 122 is connected to the gate pad electrode 18 via the protruding part PM, and the other end is connected to the source electrode 17 via the other protruding part PM. Specifically, the pn junction diodes 121 and 122 are connected to each other in parallel between the source electrode 17 and the gate pad electrode 18.

Thus, the four pn junction diodes 121 to 124 are connected in parallel on the chip side e21. Similarly, the four pn junction diodes 125 and 128 are connected in parallel on the chip side e22. Furthermore, these pn junction diodes share the gate pad electrode 18 and the source electrode 17. In other words, the eight pn junction diodes 121 to 128 are connected in parallel to form the protection diode 12d as a whole is formed between the gate and the source of the MOSFET.

Furthermore, as shown in FIG. 5, a width W1 of the conductive layer C is designed without relying on the pattern of the operation region 21 (the gate electrodes 13 and the channel regions 4). Accordingly, even when a width W2 of each of the gate electrodes 13 (the polysilicon to serve as the mask for the channel regions 4) is made smaller accompanying with the downsized transistor cells, the width W1 of the protection diode 12d is secured sufficiently for forming the contact holes CH provided in the insulating film on the protection diode 12d.

Further description will be given with reference to FIG. 6.

As shown in FIG. 6A and FIG. 2, the periphery of the pn junction diode 121 is covered with the interlayer insulating film 16, and the one end thereof (the n type semiconductor region 12n in this case) is connected to the gate pad electrode 18 via the contact hole CH formed in the interlayer insulating film 16 and the protruding part PM. The other end (another n type semiconductor region 12n) is connected to the source electrode 17 via the protruding part PM.

Accordingly, as shown in FIG. 6B, the eight pn junction diodes 121 to 128 are connected in parallel, and thereby the single protection diode 12d as a whole is formed. The protection diode 12d is connected between a source terminal S and a gate terminal G of the MOSFET having the source terminal S, the gate terminal G and a drain terminal D.

Note that the number of series connections of the pn junctions in the pn junction diodes 121 to 128 as well as the contact positions with the gate pad electrode 18 and the source electrode 17 have been exemplified, and these settings are appropriately selected in accordance with the breakdown voltage.

For example, by shifting the position of the contact hole CH for the gate pad electrode 18 in the protection diode 12d shown in FIG. 5, the breakdown voltage is easily modified. In such a case, the protruding part PM is disposed in a position corresponding to the position of the contact hole CH.

Moreover, this embodiment shows that the protection diode 12d is disposed on the two chip sides e21 and e22 which are parallel to the gate electrode 13, but may be disposed in any one of the chip sides.

Figure 7:
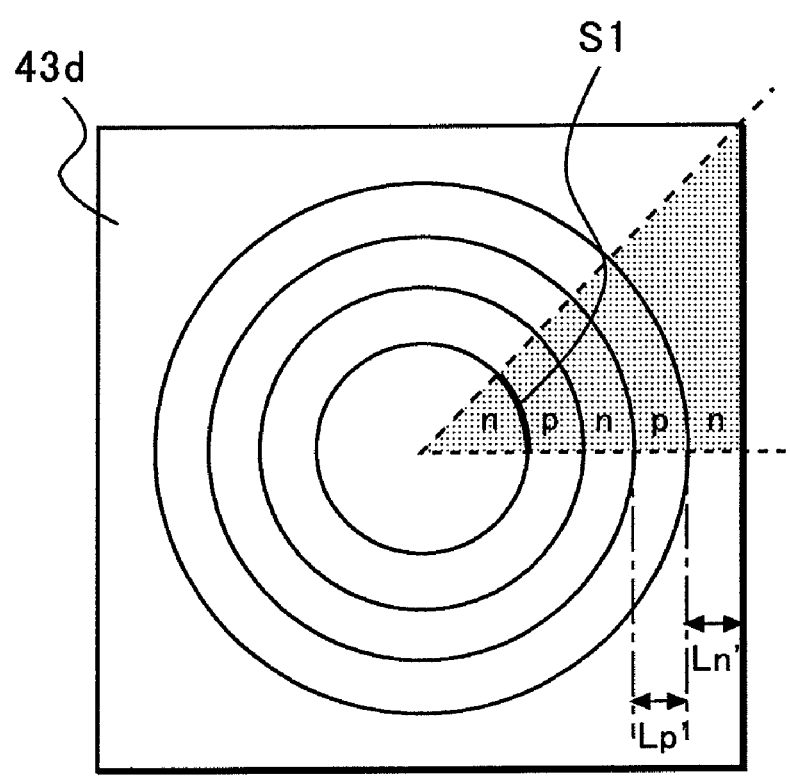
FIG. 7 is a plan view for describing a conventional protection diode and a protection diode according to the first embodiment of the present invention.
Figure 11A:
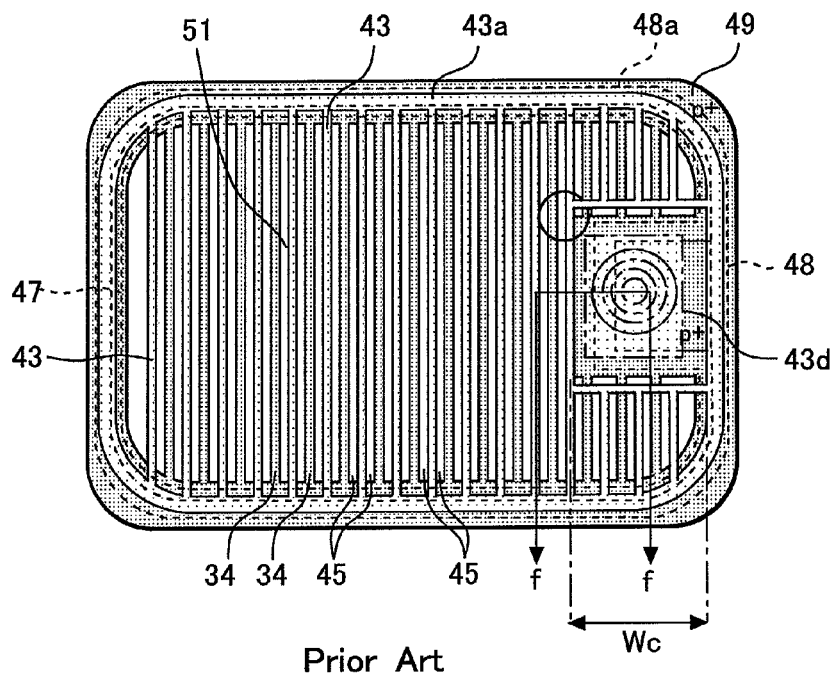
FIG. 11A is a plan view.
Figure 11B:
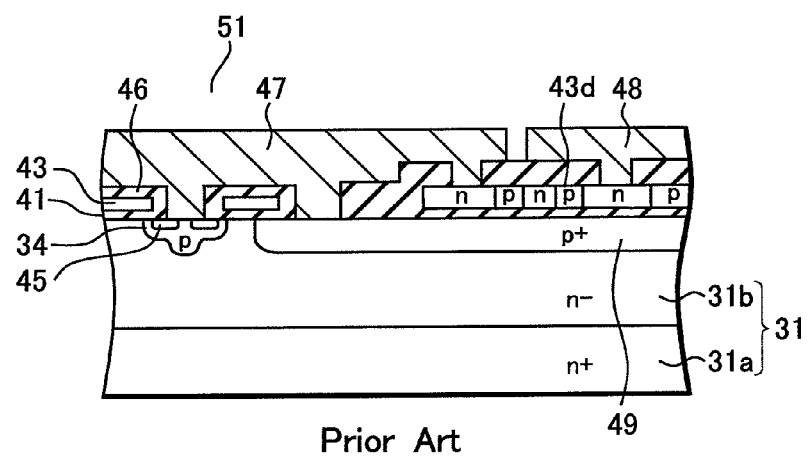
FIG. 11B is a cross-sectional view, for describing a conventional semiconductor device.
Figure 12A:
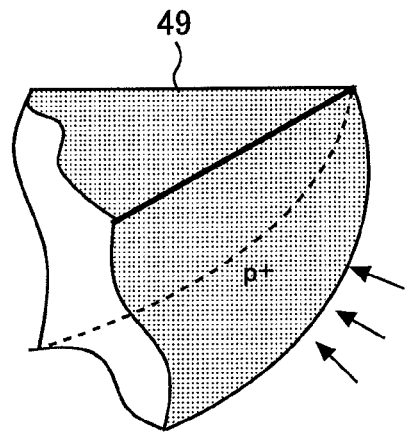
FIG. 12A is a perspective view.
Figure 12B:
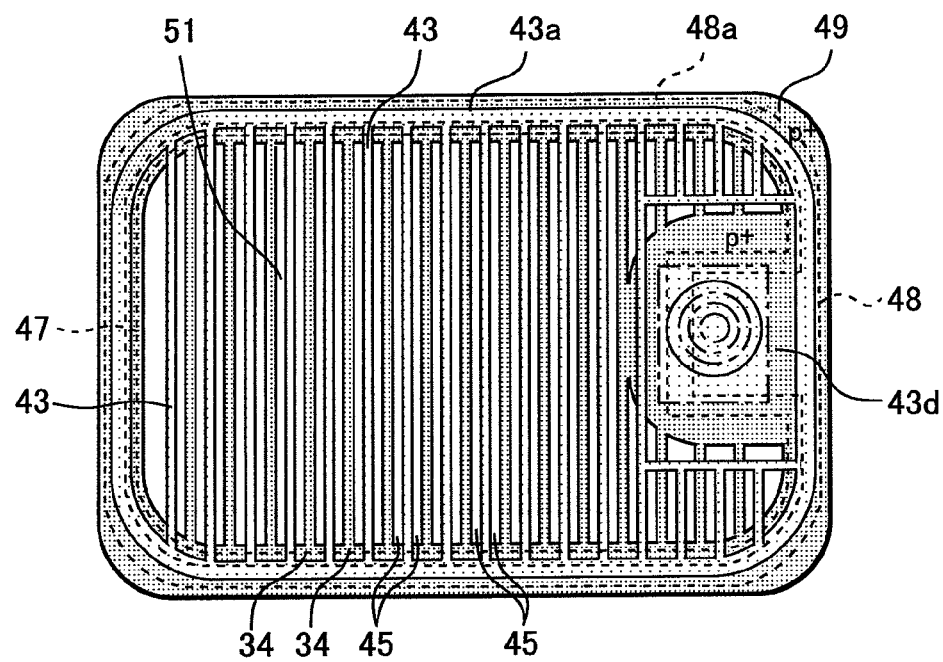
FIG. 12B is a cross-sectional view, for describing the conventional semiconductor device.

FIG. 7 shows the conventional protection diode 43d shown in FIG. 11. Generally, in the protection diode 43d, the pn junctions are connected in series in the concentric circles. Note that the impurity concentrations of the p type and n type semiconductor regions are the same as that of the preferred embodiment.

The pn junction diode 121 according to this embodiment corresponds to the portion indicated by the dashed line and the hatching in FIG. 7. In the protection diode 43d forming the pn junctions in the concentric circles, the area within the innermost periphery of the pn junction is the smallest. By this area, the current capacity of the reverse current is determined, that is, the breakdown voltage of the protection diode 43d is determined. Additionally, by series-connecting the multiple pn junctions having a predetermined breakdown voltage in the concentric circles, the breakdown voltage which is sufficient to protect the MOSFET between the gate and the source is secured.

According to this embodiment, the pn junction diodes 121 to 128 having the same configurations are connected in parallel. In other words, if a pn junction area S2 in the pn junction diode 121 is the same as a pn junction area S1 within the innermost periphery of the protection diode 43d in the concentric-circles in FIG. 7, the protection diode 12d obtains the same breakdown voltage as that of the protection diode 43d with the concentric-circular shape.

Furthermore, suppose a case where lengths Lp and Ln of the corresponding p type semiconductor region 12p and n type semiconductor region 12n according to this embodiment are respectively the same as lengths Lp' and Ln' in the protection diode 43d with the concentric-circular shape. In this case, by series-connecting the same number of the pn junctions in the pn junction diode 121 as that of the series connections of the pn junctions in the protection diode 43d with the concentric-circular shape, the same breakdown voltage as that of the protection diode 43d with the concentric-circular shape is obtained.

As described above, according to this embodiment, the breakdown voltage of the protection diode 12d is determined by the number of the series connections of the pn junctions in the pn junction diode 121 (positions of the contact holes CH for the source electrode 17 and the gate pad electrode 18).

Still furthermore, the current capacity (breakdown voltage) of the protection diode 12d is determined by the number of the parallel connections (eight in this embodiment) in the pn junction diode 121.

For this reason, the number of the series connections of the pn junctions (position of the contact hole CH for each electrode) and the number of the parallel connections are appropriately selected in accordance with the property of the protection diode 12d.

Figure 8:
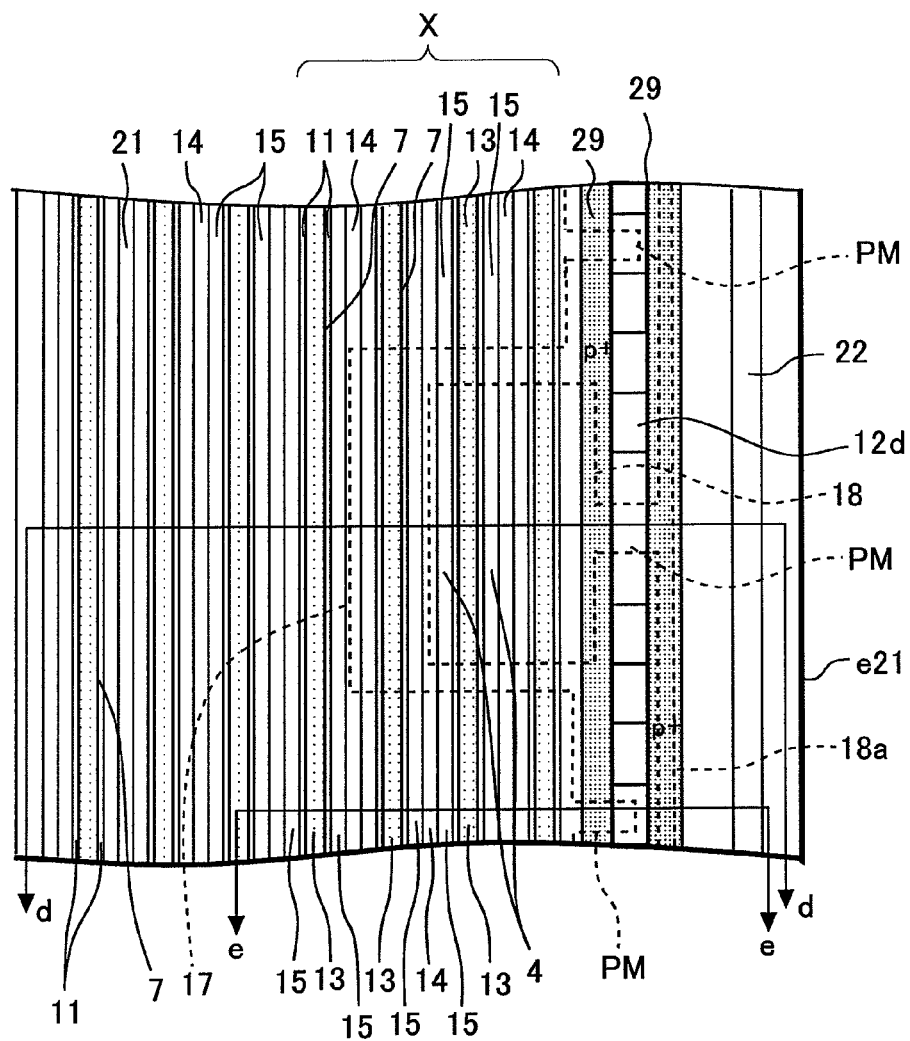
FIG. 8 is a plan view for describing another semiconductor device according to a second embodiment of the present invention.
Figure 9:
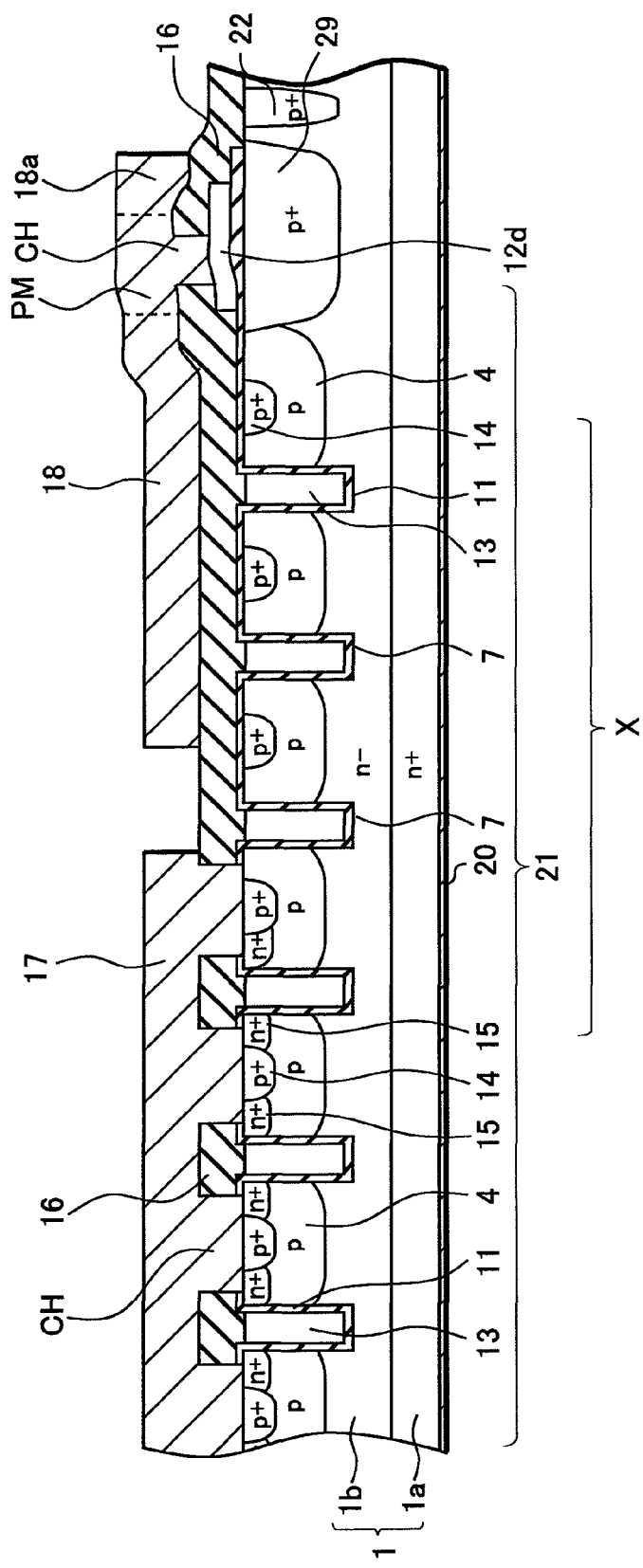
FIG. 9 is a cross-sectional view for describing the semiconductor device according to the second embodiment of the present invention.
Figure 10:
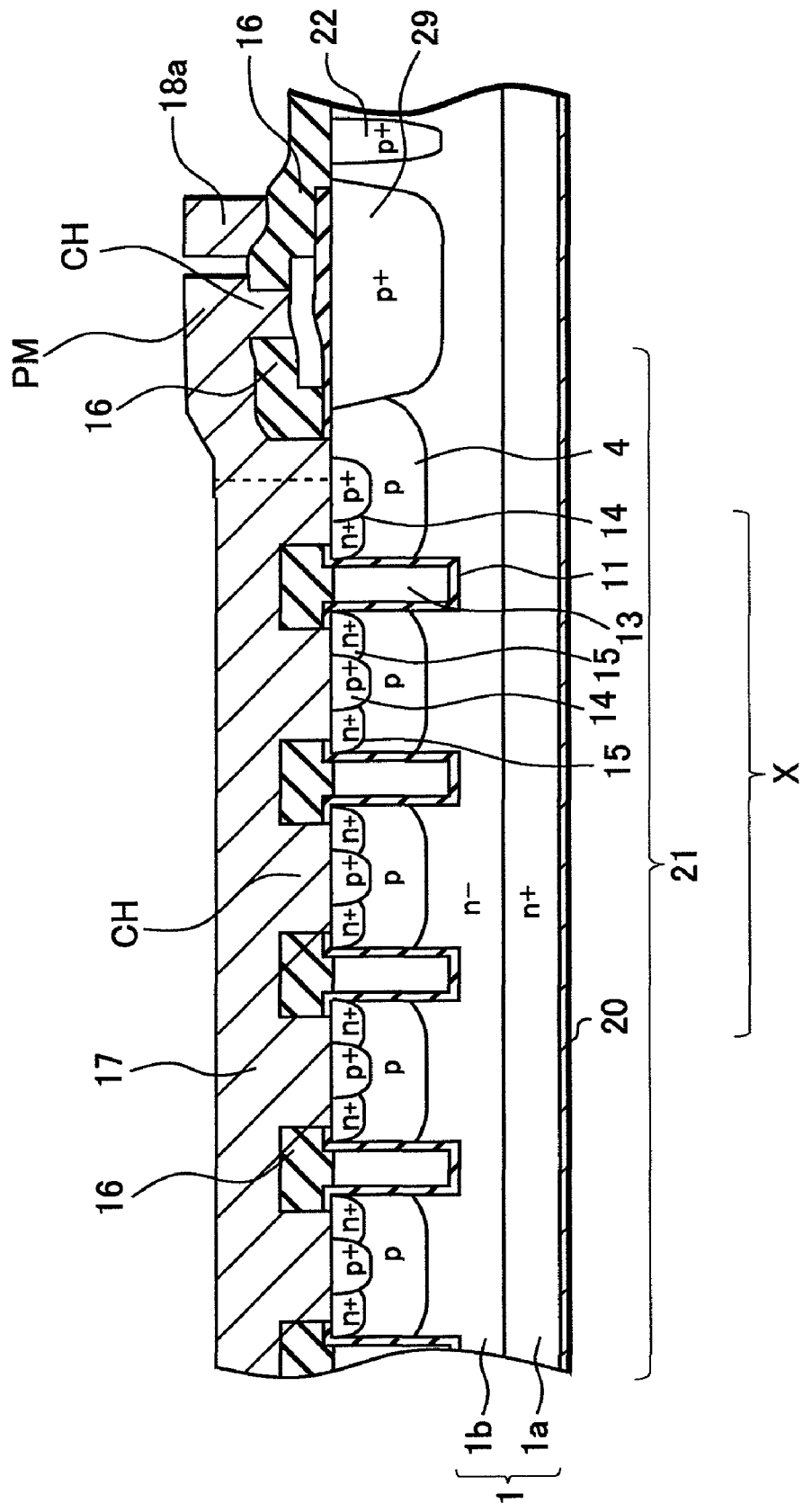
FIG. 10 is a cross-sectional view for describing the semiconductor device according to the second embodiment of the present invention.

FIG. 8 to FIG. 10 shows the second embodiment according to the present invention. FIG. 8 is a partially enlarged view for describing transistor cells. The transistor cell according to the second embodiment has a trench structure, and the other configurations are the same as those in FIG. 1. For this reason, a chip of a MOSFET 100 is referred to the plan view of FIG. 1, and description for the same constituents is omitted. Moreover, according to the second embodiment, an insulating film 11 is formed in a trench 7. Since the schematic plan view showing the connection between protection diode 12d and each electrode is the same as FIG. 4 and FIG. 5, description thereof will be given with reference to FIG. 4 and FIG. 5.

FIG. 8 is a plan view of metal electrode layers indicated by the dashed lines, and in which interlayer insulating films are omitted. FIG. 9 is a cross-sectional view taken along the line d-d in FIG. 8. FIG. 10 is a cross-sectional view taken along the line e-e in FIG. 8.

The first embodiment is so-called the MOSFET in which the gate electrodes are in the planar structure with the vertical current paths. Meanwhile, the second embodiment is the MOSFET in a trench structure.

As shown in FIG. 8, the trenches 7 are formed into a stripe shape in a plane pattern of an n type semiconductor substrate 1. In the plane pattern, gate electrodes 13, channel regions 4, source regions 15 and body regions 14 are all formed into stripe shapes along the trenches 7.

In this case also, the transistor cells are stripe shaped. The channel regions 4 and body regions 14 which are connected to the transistor cells are formed below a gate pad electrode 18. The patterns of a source electrode 17 and a gate wiring 18a are the same as those according to the first embodiment.

As shown in FIG. 9, the trenches 7 penetrate through the channel regions 4, and have the depth reaching an n− type semiconductor layer 1b. In this case, the channel regions 4 are continuously formed in the surface of the n type semiconductor substrate 1. The inner wall of the trench 7 is covered with the gate oxide film 11, and the trench 7 is filled with a polysilicon.

Below the source electrode 17, the resistance in the polysilicon in the trench 7 is to be reduced, and then the gate electrode 13 is formed. The n+ type source regions 15 are formed in the surface of the channel region 4 which is adjacent to the trenches 7. The p+ type body region 14 is formed between the adjacent source regions 15 in the surface of the channel region 4.

The interlayer insulating films 16 are formed, covering the gate electrodes 13. The source electrode 17 is in contact with the source regions 15 and the body regions 14 via contact holes CH formed in the interlayer insulating films 16.

The trenches 7, the gate electrodes 13, the body regions 14 and the channel regions 4 are disposed in the n type semiconductor substrate 1 below the gate pad electrode 18, but the gate pad electrode 18 is never in contact with the channel regions 4.

The gate pad electrode 18 is connected to each one end of the protection diode 12d via a protruding part PM and the contact hole CH formed in the interlayer insulating 16. Moreover, the gate pad electrode 18 is connected to the gate wiring 18a via the protruding part PM on a chip side e21. The gate wiring 18a is connected to the gate electrodes 13 via gate leading electrode 13a on chip sides e11 and e12 (see FIG. 4 and FIG. 5).

The transistor cells in an X region is in contact with the source electrode 17 which surrounds the gate pad electrode 18, and which is adjacent thereto. Accordingly, the electric potential of these electrodes are fixed, and thereby the transistor operation is performed.

Moreover, the channel regions 4 below the gate pad electrode 18 are fixed to the source potential. The reverse breakdown voltage between the drain and the source equal to that of an operation region 21 is secured.

On the chip sides e11 and e12, the gate leading electrode 13a is formed in a conductive layer C which surrounds the gate electrodes 13, and which is disposed at the periphery of the semiconductor chip (see FIG. 5). On the chip sides e21 and e22, p type semiconductor regions 12p and n type semiconductor regions 12n are alternately disposed adjacent to one another in the conductive layer C. Then, the implantation or the deposition of impurities is performed so as to form pn junctions.

Accordingly, four pn junction diodes 121 to 124 which are connected to the source electrode 17 and the gate pad electrode 18 at both ends, are connected to one another in parallel, and thereby the single protection diode 12d is formed. The protection diode 12d is connected between the source and the gate of the MOSFET.

According to the second embodiment, the gate electrode 13 has the trench structure. Thus, the number of the transistor cells disposed in the operation region 21 is increased as compared to the first embodiment, resulting in the increase of the cell density.

Additionally, the embodiments according to the present invention have been described by use of the n channel MOSFET. However, the same effect is obtained in a p channel MOSFET in which the conductivity type is made opposite to those embodiments, or an IGBT (Insulated Gate Bipolar Transistor) in which a p type (n type) substrate is disposed below an n+ (p+) type semiconductor substrate of a MOSFET, as well.

According to the present invention, provided is the MOSFET in which a high reverse breakdown voltage between the drain and the source is secured without reducing the area of the operation region. Specifically, the transistor cells are formed in the stripe shape, some of the channel regions are disposed below the gate pad electrode, and thereby the source potential is applied to the channel regions. The channel regions below the gate pad electrode is formed in the same pattern as that of the operation region of the MOSFET. Thus, the reverse breakdown voltage between the drain and the source equal to that of the operation region is secured even below the gate pad electrode.

For this reason, even when the reverse breakdown voltage between the drain and the source is modified, a predetermined breakdown voltage is secured without modifying the pattern (curvature at the corner) of the p+ type impurity region which was necessity conventionally. For example, when higher breakdown voltage is secured, conventionally there has been a problem that the operation region (the number of the areas for disposing the transistor cells) has to be reduced in accordance with the modification of the pattern of the p+ type impurity region. In contrast, according to the present embodiments, the reverse breakdown voltage between the drain and the source is secured in the channel regions below the gate pad electrode, instead of the conventional p+ type impurity region having a large area. In addition, the area for the operation region is secured as that of the conventional operation region.

Moreover, provided is the protection diode between the gate and the source, in which the pn junction diodes with the stripe shape are formed as surrounding the outer periphery of all the gate electrodes, and as extending along a side of the chip. Additionally, in the protection diode, the gate potential is applied to one end of the pn junction diode, and the source potential is applied to the other end of the pn junction diode. According to the present embodiments, the channel regions are formed below the gate pad electrode. The following protection diode is conceivable. Specifically, the protection diode is provided by forming the pn junction diodes while utilizing the polysilicon with the stripe shape below the gate pad electrode when the protection diode is connected between the gate and the source, Nevertheless, when the protection diode with the stripe shape is formed below the gate pad electrode, the protection diode is caused to be downsized accompanying with the downsized gate electrodes, since the protection diode is formed in the same pattern as that of the gate electrodes. As a result, it is made difficult to form the contact holes therein.

On the other hand, according to the present embodiments, the protection diode is made by forming, outside the operation region, the pn junction diodes in some of the polysilicon (gate leading electrode) having the larger width than that of the gate electrodes. As a result, the protection diode is disposed with no influence from the downsized gate electrodes.

Furthermore, the breakdown voltage of the protection diode can be arbitrarily set by appropriately selecting the positions of the contact holes for the gate pad electrode, the source electrode, and the pn junction diode with the stripe shape.

What is claimed is:

1. A transistor device comprising a protection diode device, comprising:
  a semiconductor substrate;
  a transistor formed on the semiconductor substrate;
  a gate pad electrode disposed on the semiconductor substrate and connected to the transistor;
  a source electrode disposed on and connected to the transistor;
  a first diode series comprising a plurality of pn junctions connected serially, one end of the first diode series being connected to the gate pad electrode and another end of the first diode series being connected to the source electrode; and
  a second diode series comprising a plurality of pn junctions connected serially, one end of the second diode series being connected to the gate pad electrode and another end of the second diode series being connected to the source electrode,
  wherein the first diode series and the second diode series are aligned along an edge of the semiconductor substrate, the edge extending in a first direction, and
  all of the pn junctions in the first diode series and the second diode series are aligned parallel in a second direction that is different from the first direction.

2. The transistor device of claim 1, wherein, in plan view of the semiconductor substrate, the first and second diode series form a line along an edge of the semiconductor substrate and is disposed between the gate pad electrode and the edge of the semiconductor substrate.

3. The transistor device of claim 1, further comprising a third diode series comprising a plurality of pn junctions connected serially, one end of the third diode series being connected to the another end of the first diode series and another end of the third diode series being connected to the gate pad electrode.

4. The transistor device of claim 3, further comprising a gate wiring connecting the gate pad electrode and the another end of the third diode series, wherein, in plan view of the semiconductor substrate, the first, second and third diode series form a line along an edge of the semiconductor substrate, and the gate wiring is disposed between the line and the edge of the semiconductor substrate.

5. The transistor device of claim 1, further comprising a gate wiring connecting the gate pad electrode and the one end of the second diode series, wherein, in plan view of the semiconductor substrate, the first and second diode series form a line along an edge of the semiconductor substrate, and the gate wiring is disposed between the line and the edge of the semiconductor substrate.

6. The transistor device of claim 5, further comprising a third diode series comprising a plurality of pn junctions connected serially, one end of the third diode series being connected to the one end of the first diode series and another end of the third diode series being connected to the source electrode, wherein the third diode series extends from the line.

7. The transistor device of claim 1, further comprising a third diode series comprising a plurality of pn junctions connected serially, one end of the third diode series being connected to the another end of the first diode series and another end of the third diode series being connected to the gate pad electrode, and a fourth diode series comprising a plurality of pn junctions connected serially, one end of the fourth diode series being connected to the another end of the second diode series and another end of the fourth diode series being connected to the gate pad electrode.

8. The transistor device of claim 7, further comprising a gate wiring connecting the gate pad electrode and the another ends of the third and fourth diode series, wherein, in plan view of the semiconductor substrate, the first, second, third and fourth diode series form a line along an edge of the semiconductor substrate, and the gate wiring is disposed between the line and the edge of the semiconductor substrate.

9. The transistor device of claim 1, wherein the second direction is substantially perpendicular to the first direction.

* * * * *